United States Patent
Tsuji et al.

(10) Patent No.: US 9,885,118 B2
(45) Date of Patent: Feb. 6, 2018

(54) TEMPLATE FORMING METHOD, TEMPLATE, AND TEMPLATE BASE MATERIAL

(71) Applicant: TOSHIBA MEMORY CORPORATION, Tokyo (JP)

(72) Inventors: Masatoshi Tsuji, Kanagawa (JP); Masayuki Hatano, Kanagawa (JP); Yohko Komatsu, Kanagawa (JP); Tetsuro Nakasugi, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 162 days.

(21) Appl. No.: 14/844,050

(22) Filed: Sep. 3, 2015

(65) Prior Publication Data

US 2016/0247673 A1  Aug. 25, 2016

(30) Foreign Application Priority Data

Feb. 24, 2015  (JP) .................. 2015-034019

(51) Int. Cl.
*H01L 21/027* (2006.01)
*C23F 1/16* (2006.01)
*G03F 7/00* (2006.01)

(52) U.S. Cl.
CPC .............. *C23F 1/16* (2013.01); *G03F 7/0002* (2013.01)

(58) Field of Classification Search
None
See application file for complete search history.

(56) References Cited

U.S. PATENT DOCUMENTS

| | | | |
|---|---|---|---|
| 2003/0047822 A1* | 3/2003 | Hori | B29C 33/42 264/1.21 |
| 2010/0233432 A1* | 9/2010 | Okushima | B82Y 10/00 428/156 |
| 2010/0264113 A1* | 10/2010 | Yoneda | B82Y 10/00 216/41 |
| 2011/0059406 A1* | 3/2011 | Kawamura | G03F 7/0002 430/323 |
| 2011/0104439 A1* | 5/2011 | Choi | C03C 15/00 428/142 |
| 2012/0013042 A1 | 1/2012 | Ota | |
| 2014/0011013 A1* | 1/2014 | Jin | B05D 5/08 428/297.4 |
| 2014/0072668 A1 | 3/2014 | Yoneda et al. | |

(Continued)

FOREIGN PATENT DOCUMENTS

| | | | |
|---|---|---|---|
| JP | 2012-006219 | 1/2012 | |
| JP | 2012-164787 A * | 8/2012 | .......... H01L 21/027 |
| JP | 2014-013902 | 1/2014 | |

(Continued)

*Primary Examiner* — Shamim Ahmed
(74) *Attorney, Agent, or Firm* — Finnegan, Henderson, Farabow, Garrett & Dunner, L.L.P.

(57) ABSTRACT

According to one embodiment, a template forming method is provided. In the template forming method, a template pattern is formed on a first surface of a substrate. A high liquid repellent property portion is formed in a region different from the template pattern on a side of the first surface of the substrate. The high liquid repellent property portion has a higher contacting angle with respect to a resist than a portion without the high liquid repellent property portion formed therein.

25 Claims, 10 Drawing Sheets

(56) References Cited

U.S. PATENT DOCUMENTS

2015/0037540 A1* 2/2015 Kobayashi ............ G03F 7/0002
428/172
2016/0338228 A1* 11/2016 Suzuki ............... H05K 7/20436

FOREIGN PATENT DOCUMENTS

| JP | 2014-051050 | 3/2014 |
|----|-------------|--------|
| JP | 2014-160754 | 9/2014 |
| JP | 5618663 | 11/2014 |

* cited by examiner

TEMPLATE FORMING METHOD, TEMPLATE, AND TEMPLATE BASE MATERIAL

CROSS-REFERENCE TO RELATED APPLICATIONS

This application is based upon and claims the benefit of priority from Japanese Patent Application No. 2015-034019, filed on Feb. 24, 2015; the entire contents of which are incorporated herein by reference.

FIELD

Embodiments described herein relate generally to a template forming method, a template, and a template base material.

BACKGROUND

An imprint method for transferring a mold of an original plate to a substrate has been given attention as a technique for forming a fine pattern of a semiconductor device, and the like with high productivity. In the imprint method, a template (original plate) formed with a concave-convex pattern (template pattern) and a resist applied on the substrate are brought into contact. The concave-convex pattern of the template is thereby filled with resin. The template pattern is transferred to the resist on the substrate by curing the filled resist.

When the template is impressed on the resist, the resist runs out to the outer side of a template pattern region, and such run-out degrades the quality of the resist pattern.

DETAILED DESCRIPTION

Exemplary embodiments of a template forming method, a template, and a template base material according to an embodiment will be explained below in detail with reference to the accompanying drawings. The present invention is not limited to the following embodiments.

According to the embodiment, a template forming method is provided. In the template forming method, the template pattern is formed on a first surface of the substrate. A high liquid repellent property portion is formed in a region different from the template pattern on a side of the first surface of the substrate. The high liquid repellent property portion has a higher contacting angle with respect to the resist than a portion without the high liquid repellent property portion formed therein.

First Embodiment

Figure 1A:
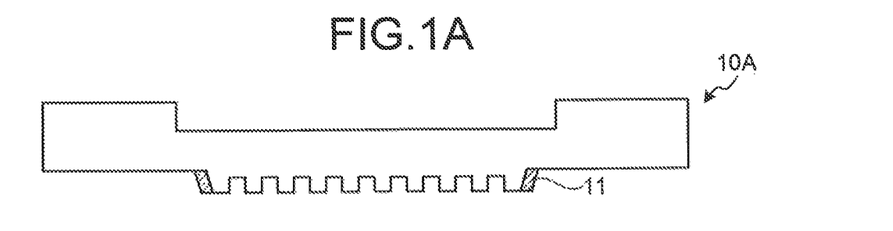
FIGS. 1A and 1B are cross-sectional views schematically illustrating a configuration example of a template according to a first embodiment.
Figure 1B:
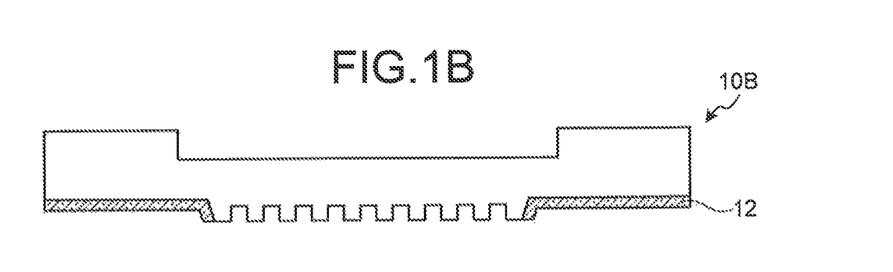

FIGS. 1A and 1B are cross-sectional views schematically illustrating a configuration example of a template according to a first embodiment. Templates 10A, 10B are formed by processing a plate-shaped template base material.

The templates 10A, 10B according to the first embodiment each includes a pedestal unit (mesa) at a central region on a front surface side (bottom surface side in FIGS. 1A and 1B). The pedestal unit is higher than an outer peripheral region on the front surface side of the templates 10A, 10B by a predetermined thickness. In the templates 10A, 10B, a template pattern (concave-convex pattern) is formed on an upper surface side of the pedestal unit.

The template 10A illustrated in FIG. 1A is formed with a liquid repellent portion 11 at the side surface of the pedestal unit. The liquid repellent portion 11 has a higher liquid repellent property with respect to a resist than the front surface (for example, template pattern surface), the back surface, the side surface, or quartz of the template 10A. The template 10B illustrated in FIG. 1B is formed with a liquid repellent portion 12 at the side surface of the pedestal unit and an outer peripheral region on the outer side of the pedestal unit. The liquid repellent portion 12 has a higher liquid repellent property with respect to a resist than the front surface (template pattern surface), the back surface, the side surface, or quartz of the template 10B.

The liquid repellent portion 11 is formed to surround the side surface of the pedestal unit. The liquid repellent portion 12 is formed to surround the side surface and the outer peripheral region of the pedestal unit. The contacting angle with respect to the resist in the liquid repellent portions 11, 12 is higher than a predetermined value (e.g., 60°). The resist is a mixture having a resin (polymer), a photosensitizing agent, an additive, and a solvent as main components. Other than a photo-polymerization initiator, the resist may include an acryl-based monomer, acrylate, and the like depending on the chemicals.

In the present embodiment, a member having a high liquid repellent property is arranged on at least the side surface of the pedestal unit of the front surface side of the templates 10A, 10B. According to such configuration, when the templates 10A, 10B are pressed against the resist, the resist can be prevented from leaking out to the outer side of the pedestal unit.

An imprint process using the templates 10A, 10B will now be described. The imprint processes using the templates 10A, 10B are similar processes, and thus the imprint process using the template 10A will be described herein.

Figure 2A:
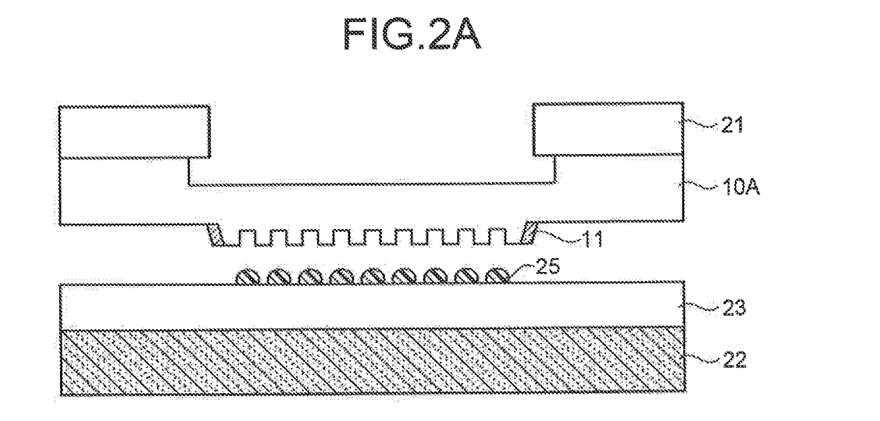
FIGS. 2A to 2C are views describing an imprint process using the template according to the first embodiment.
Figure 2B:
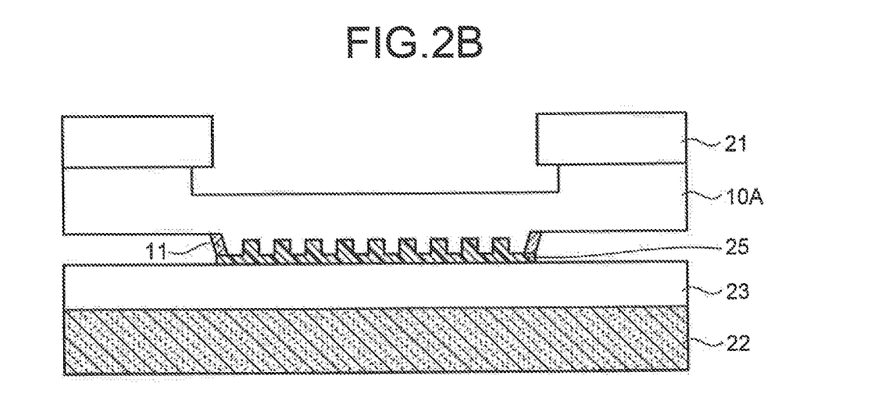
Figure 2C:
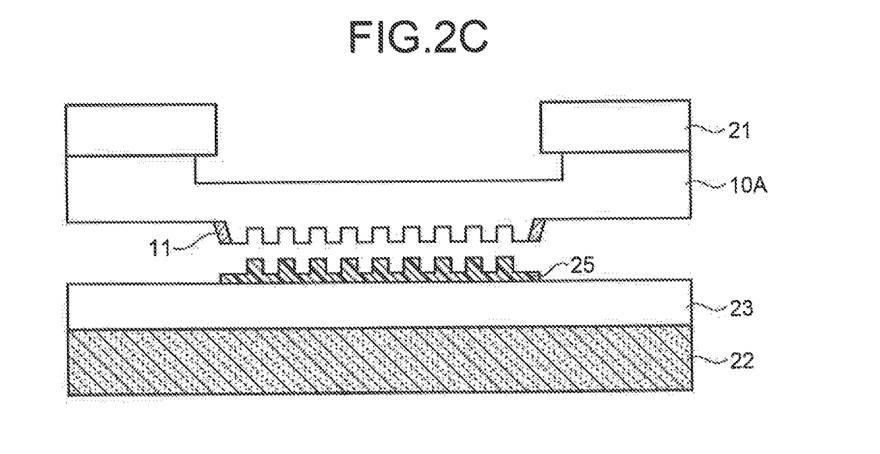

FIGS. 2A to 2C are views describing the imprint process using the template according to the first embodiment. A processing film 23 is formed on a wafer 22, which is a processing substrate. A resist 25 is dropped on the processing film 23.

The imprint device (not illustrated) includes an original plate stage (template holding member) 21. As illustrated in FIG. 2A, the original plate stage 21 fixes the template 10A at a predetermined position by vacuum adsorbing the template 10A from the back surface side of the template 10A (surface on a side the template pattern is not formed) (upper surface side in FIGS. 2A to 2C).

Thereafter, the template 10A is pressed against the resist 25. As illustrated in FIG. 2B, a distance between the template 10A and the processing film 23 (wafer 22) approaches a predetermined distance. Since the template 10A includes the liquid repellent portion 11, the resist 25 can be suppressed from running out from the pedestal unit, which is a forming region of the template pattern, when the template 10A is pressed against the resist 25. The resist 25 is filled in the template pattern by bringing the template 10A and the resist 25 into contact for a predetermined time.

When the template 10A is irradiated with a UV light in this state, the resist 25 is irradiated with the UV light and the resist 25 is cured as a result. A transfer pattern corresponding to the template pattern is thereby patterned on the resist 25 on the wafer 22. Subsequently, as illustrated in FIG. 2C, the template 10A is pulled away from the resist 25.

Therefore, in the present embodiment, the template 10A includes the liquid repellent portion 11. Thus, when the template 10A is impressed on the resist 25, the resist 25 is less likely to ride over the liquid repellent portion 11. The run-out of the resist 25 from the template pattern thus can be suppressed. Therefore, the template 10A can be prevented from riding on the cured resist 25 in the imprint process to an adjacent shot. As a result, the breakage of the template 10A can be prevented. Furthermore, the degradation in the quality of the resist pattern can be prevented since the run-out of the resist 25 can be suppressed.

The liquid repellent portions 11, 12 may be formed before forming the template pattern, or may be formed after forming the template pattern. If the liquid repellent portions 11, 12 are formed before forming the template pattern, the liquid repellent portions 11, 12 are formed with respect to the template base material.

Figure 3A:
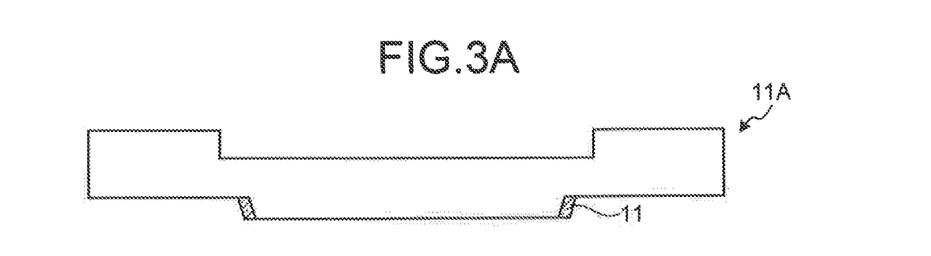
FIGS. 3A and 3B are cross-sectional views schematically illustrating a configuration example of a template base material according to the first embodiment.
Figure 3B:
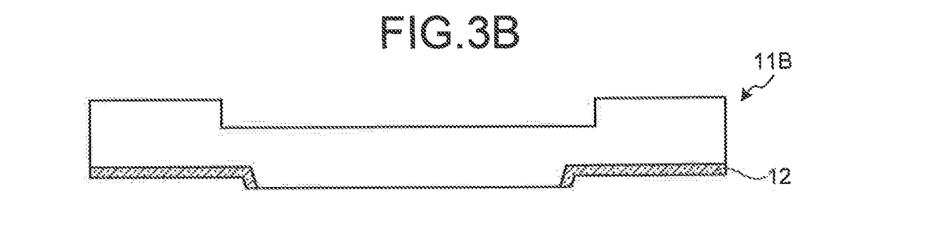

FIGS. 3A and 3B are cross-sectional views schematically illustrating a configuration example of the template base material according to the first embodiment. Template base materials 11A, 11B are substrates before the template pattern is formed.

The template base materials 11A, 11B according to the first embodiment include the pedestal unit at the central region on the front surface side (bottom surface side in FIGS. 3A and 3B). The pedestal unit is higher than the outer peripheral region on the front surface side of the template base materials 11A, 11B by a predetermined thickness. The upper surface side of the pedestal unit is the region where the template pattern is formed.

The template base material 11A illustrated in FIG. 3A is formed with the liquid repellent portion 11 at the side surface of the seat unit. The liquid repellent portion 11 has a higher liquid repellent property with respect to a resist than the upper surface of the seat unit, and the back surface, the side surface, or quartz of the template base material 11A. The template base material 11B illustrated in FIG. 3B is formed with the liquid repellent portion 12 at the side surface of the seat unit and the outer peripheral region on the outer side of the seat unit. The liquid repellent portion 12 has a higher liquid repellent property with respect to a resist than the upper surface of the seat unit, and the back surface, the side surface, or quartz of the template base material 11A.

In the present embodiment, a member having a high liquid repellent property is arranged on at least the side surface of the pedestal unit of the front surface side of the template base materials 11A, 11B. According to such configuration, the templates 10A, 10B can be produced by forming the template pattern in the template base materials 11A, 11B. As a result, the resist 25 can be prevented from leaking out to the outer side of the pedestal unit when the templates 10A, 10B are pressed against the resist 25.

Next, a method for producing the templates 10A, 10B and the template base materials 11A, 11B will be described. The production processes of the templates 10A, 10B, and the template base materials 11A, 11B are similar processes, and thus the production method of the template base material 11B will be described herein.

Figure 4A:
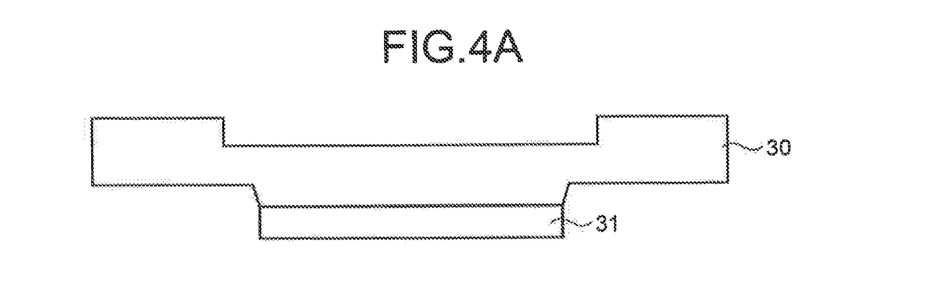
FIGS. 4A to 4C are views illustrating a production process procedure of the template base material according to the first embodiment.
Figure 4B:
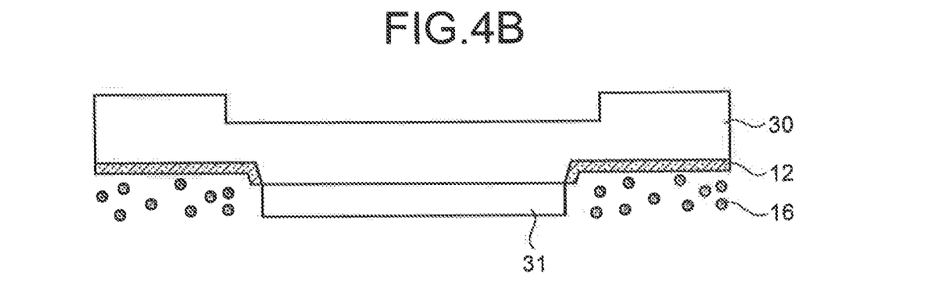
Figure 4C:
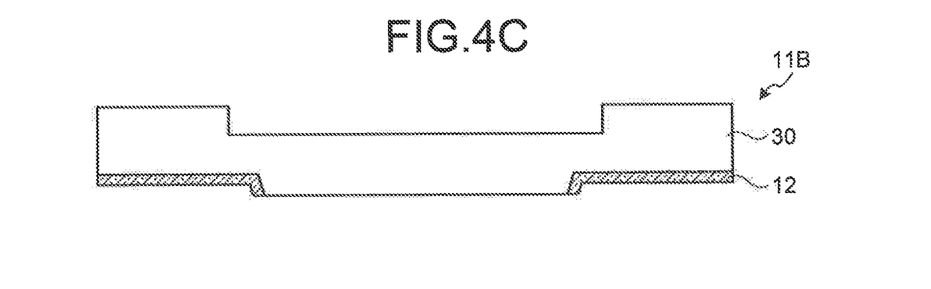

FIGS. 4A to 4C are views illustrating a production process procedure of the template base material according to the first embodiment. A spot facing processing is carried out on the back surface side of the region to be formed with the template pattern with respect to a quartz glass substrate (flat plate). Furthermore, the pedestal unit is formed with respect to the quartz glass substrate. The quartz glass substrate is a substrate 30 before the liquid repellent portion 12 is formed.

Thereafter, as illustrated in FIG. 4A, a protecting portion 31 is formed on the pedestal unit with respect to the substrate 30. The protecting portion 31 is formed using a chemical having a high liquid repellent property (weak adhesiveness), and the like with respect to the quartz glass substrate. The protecting portion 31 protects the template pattern region (upper surface of pedestal unit) from the chemicals used to form the liquid repellent portion 12. The protecting portion 31 is formed in the template pattern region where the liquid repellent portion 12 is not to be formed.

When forming the protecting portion 31, the chemicals having a high liquid repellent property with respect to the substrate 30 is attached to the region (upper surface of pedestal unit) to form the protecting portion 31 in the substrate 30. The chemical is a chemical containing silane such as silane coupling agent, and the like.

The substrate 30 formed with the protecting portion 31 is exposed to an atmosphere of a chemical 16 having a high liquid repellent property with respect to the resist 25. The chemical 16 is, for example, a fluorinated solvent such as perfluoropolyether (PEPE), and the like. The chemical 16 is, for example, a 20% liquid solution of water repellent coating agent in which the undiluted solution of a water repellent coating agent is diluted with a solvent.

When forming the liquid repellent portion 12, the substrate 30 is arranged such that the chemical 16 and the upper surface of the pedestal unit face each other. The chemical 16 is then heated to evaporate the chemical 16. The evaporated chemical 16 thereby attaches to the side surface of the pedestal unit and the outer peripheral region on the outer side of the pedestal unit to form the liquid repellent portion 12, as illustrated in FIG. 4B. Thereafter, as illustrated in FIG.

4C, the protecting portion 31 is removed from the substrate 30, whereby the substrate 30 becomes the template base material 11B.

The protecting portion 31 may be formed by attaching a protective film such as a resin film, and the like. The protecting portion 31 may be a metal film or a semiconductor film. In this case, the metal film or the semiconductor film is formed on the upper surface of the pedestal unit to form the protecting portion 31. The protecting portion 31 may be a shielding member. In this case, the protecting portion 31 serving as the shielding member is proximately arranged with respect to the pattern surface, and then the substrate 30 is exposed to the atmosphere of the chemicals 16. A hard mask thus protects the upper surface of the pedestal unit from the chemical 16, and the chemical 16 attaches to the side surface of the pedestal unit and the outer peripheral region on the outer side of the pedestal unit to become the liquid repellent portion 12. Furthermore, when forming the liquid repellent portion 12, the protecting portion 31 is arranged on the substrate 30, and then the substrate 30 may be immersed in the chemical 16.

Therefore, according to the first embodiment, the template pattern is formed on the template pattern surface on the front surface of the substrate 30. The liquid repellent portions 11, 12 are formed in regions different from the template pattern surface. The liquid repellent portions 11, 12 have a higher contacting angle than the front surface (for example, template pattern surface), the back surface, the side surface, or quartz of the substrate 30. Therefore, when the templates 10A, 10B are impressed on the resist 25, the resist 25 is repelled by the liquid repellent portions 11, 12. The run-out of the resist 25 when the templates 10A, 10B are impressed on the resist 25 thus can be suppressed. As a result, the desired resist pattern can be formed, and the breakage of the templates 10A, 10B can be prevented.

Second Embodiment

A second embodiment will now be described using FIGS. 5A to 5D. In the second embodiment, the protecting portion 31 and the liquid repellent portion 12 are formed through a method similar to the first embodiment. The protecting portion 31 is removed by carrying out RIE (Reactive Ion Etching).

Figure 5A:
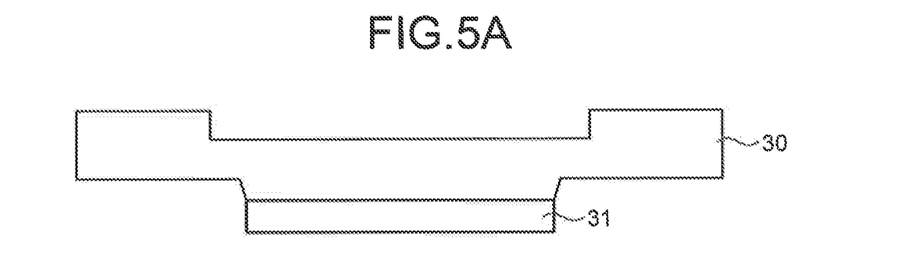
FIGS. 5A to 5D are views illustrating a production process procedure of a template base material according to a second embodiment.
Figure 5B:
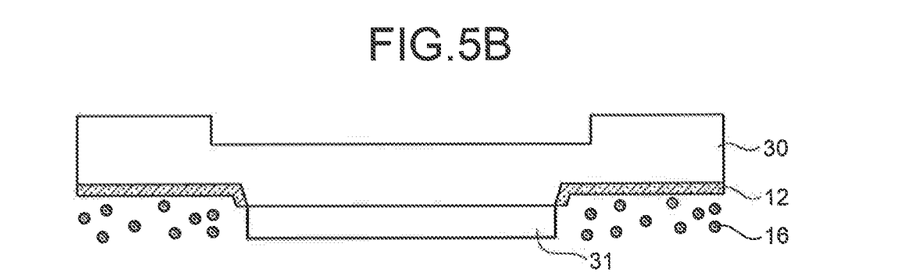
Figure 5C:
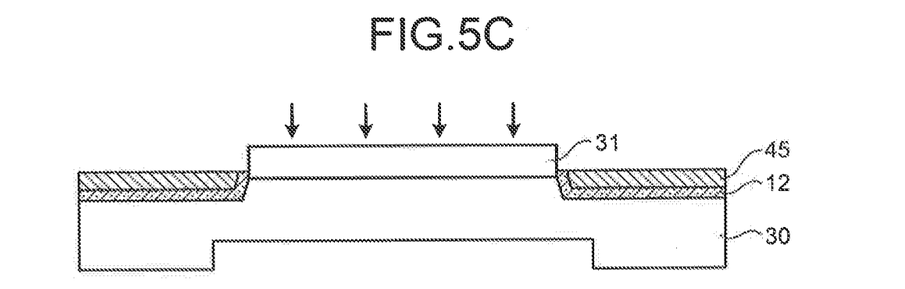

FIGS. 5A to 5D are views illustrating a production process procedure of a template base material according to the second embodiment. Among the processes illustrated in FIGS. 5A to 5D, the description on the processes similar to the first embodiment will be omitted. The substrate 30 illustrated in FIG. 5C is turned upside down from the substrate 30 illustrated in FIG. 5B.

In the second embodiment, the spot facing processing and the formation of the pedestal unit are carried out with respect to the quartz glass substrate, similar to the first embodiment. The quartz glass substrate thus becomes the substrate 30 before the liquid repellent portion 12 is formed.

Thereafter, the protecting portion 31 is formed on the pedestal unit, as illustrated in FIG. 5A, with respect to the substrate 30. As illustrated in FIG. 5B, the evaporated chemical 16 attaches to the side surface of the pedestal unit and the outer peripheral region on the outer side of the pedestal unit to become the liquid repellent portion 12.

Thereafter, as illustrated in FIG. 5C, the liquid repellent portion 12 is covered with a protective film 45. The RIE is carried out from above the protecting portion 31 to remove the protecting portion 31 from the substrate 30. Thereafter, the protective film 45 is removed from the substrate 30.

Figure 5D:
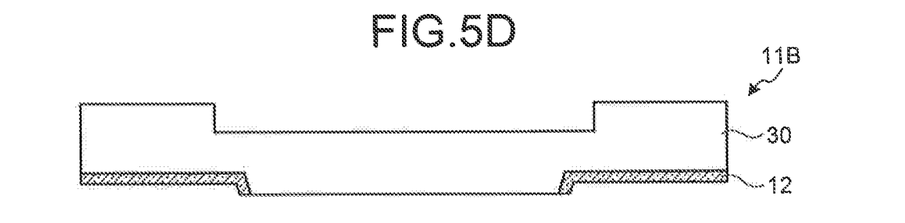

Thus, the substrate 30 becomes the template base material 11B, as illustrated in FIG. 5D.

The protecting portion 31 may be removed using a liquid (solvent) such as a thinner, and the like in place of the RIE. When forming the liquid repellent portion 12, the protecting portion 31 may be arranged on the substrate 30, and then the substrate 30 may be immersed in the chemical 16.

Therefore, according to the second embodiment, the protecting portion 31 is removed using the RIE or the liquid such as the thinner, and the like, whereby the protecting portion 31 can be easily and accurately removed when producing the template base material 11B.

Third Embodiment

A third embodiment will now be described using FIGS. 6A to 6C. In the third embodiment, the upper surface and the side surface of the pedestal unit and the outer peripheral region on the outer side of the pedestal unit are covered with the chemical 16, from which the liquid repellent portion 12 is formed. The chemical 16 on the pedestal unit is then removed.

Figure 6A:
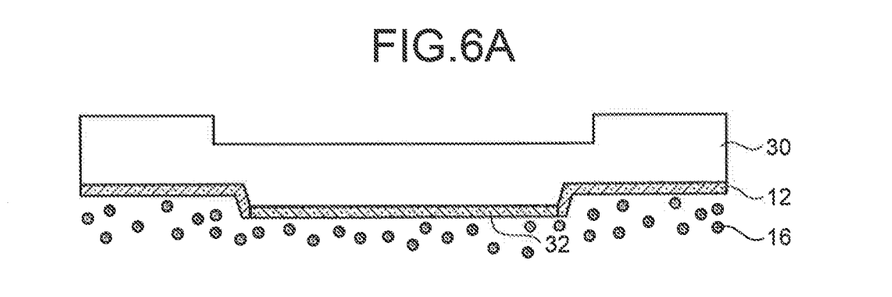
FIGS. 6A to 6C are views illustrating a production process procedure of a template base material according to a third embodiment.
Figures 6B, 6C:
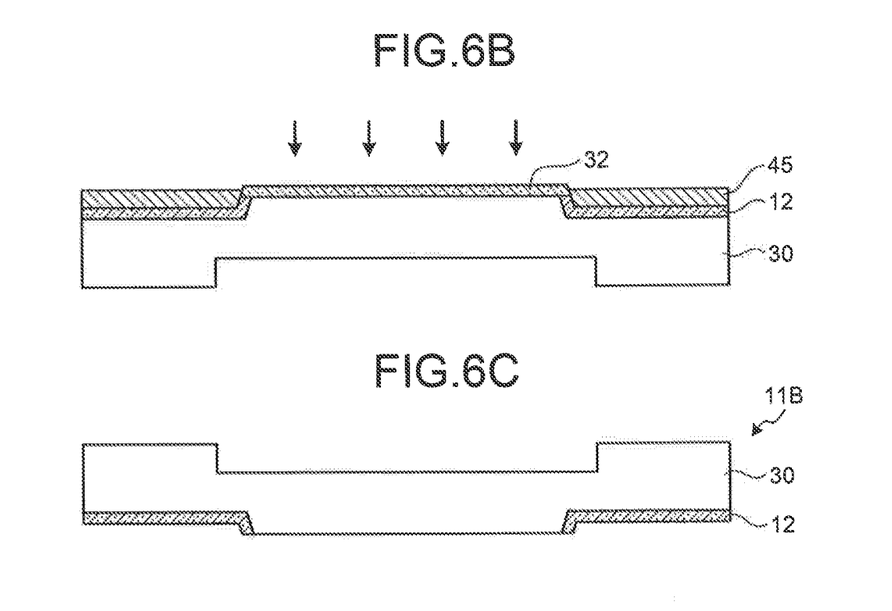

FIGS. 6A to 6C are views illustrating a production process procedure of a template base material according to the third embodiment. Among the processes illustrated in FIGS. 6A to 6C, the description on the processes similar to the first and second embodiments will be omitted. The substrate 30 illustrated in FIG. 6B is turned upside down from the substrate 30 illustrated in FIG. 6A.

In the third embodiment, the spot facing processing and the formation of the pedestal unit are carried out with respect to the quartz glass substrate, similar to the first embodiment. The quartz glass substrate thereby becomes the substrate 30 before the liquid repellent portion 12 is formed.

When forming the liquid repellent portion 12, the substrate 30 is arranged such that the chemical 16 and the upper surface of the pedestal unit face each other. In other words, the upper surface of the pedestal unit is brought into contact with the chemical 16. The chemical 16 is then heated to evaporate the chemical 16.

As illustrated in FIG. 6A, the evaporated chemical 16 attaches to the upper surface and the side surface of the pedestal unit and the outer peripheral region on the outer side of the pedestal unit. In other words, the evaporated chemical 16 attaches to the front surface (surface on the side formed with the pedestal unit) of the substrate 30.

As a result, the chemical 16 attached to the side surface of the pedestal unit and the outer peripheral region on the outer side of the pedestal unit becomes the liquid repellent portion 12, and the chemical 16 attached to the upper surface of the pedestal unit becomes a liquid repellent portion 32. The liquid repellent portion 32 is a film formed at a position similar to the protecting portion 31.

Thereafter, as illustrated in FIG. 6B, the liquid repellent portion 12 is covered with the protective film 45. The RIE is carried out from above the liquid repellent portion 32 to remove the liquid repellent portion 32 from the substrate 30. Thereafter, the protective film 45 is removed from the substrate 30. Thus, as illustrated in FIG. 6C, the substrate 30 becomes the template base material 11B. The liquid repellent portion 32 may be removed using a liquid (solvent) such as thinner, and the like in place of the RIE.

Therefore, according to the third embodiment, the liquid repellent portion 32 is formed on the pedestal unit using the chemical 16, so that the liquid repellent portion 12 and the liquid repellent portion 32, which is a substitute of the protecting portion 31, can be simultaneously formed. The upper surface of the pedestal unit thus can be easily covered. Therefore, the template base material 11B can be easily produced.

Fourth Embodiment

A fourth embodiment will now be described using FIGS. 7A to 7C. In the fourth embodiment, the front surface of the substrate 30 is immersed in a liquid (solvent 17 to be hereinafter described) similar to the chemical 16. The upper surface and the side surface of the pedestal unit and the outer peripheral region on the outer side of the pedestal unit are thereby covered with the film of the fluid 17. Thereafter, the film on the pedestal unit is removed.

Figure 7A:
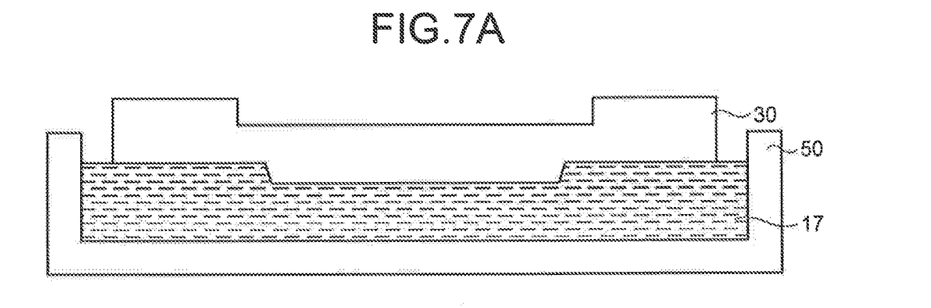
FIGS. 7A to 7C are views illustrating a production process procedure of a template base material according to a fourth embodiment.
Figure 7B:
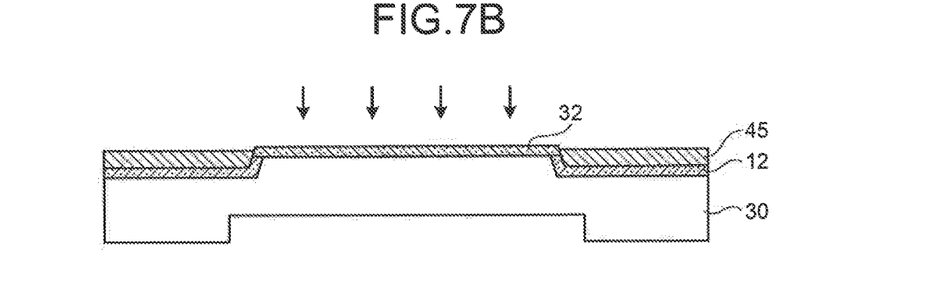
Figure 7C:
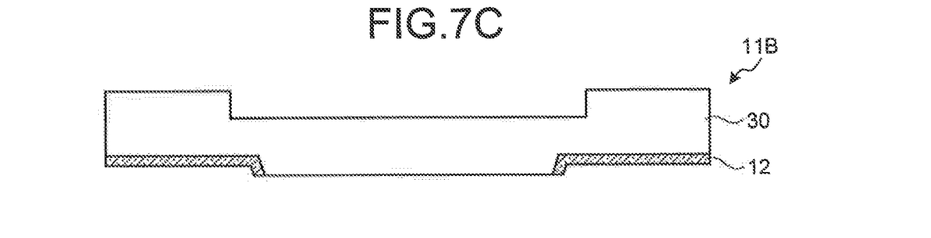

FIGS. 7A to 7C are views illustrating a production process procedure of a template base material according to the fourth embodiment. Among the processes illustrated in FIGS. 7A to 7C, the description on the processes similar to the first to third embodiments will be omitted. The substrate 30 illustrated in FIG. 7B is turned upside down from the substrate 30 illustrated in FIG. 7A.

In the fourth embodiment, the spot facing processing and the formation of the pedestal unit are carried out with respect to the quartz glass substrate, similar to the first embodiment. Thus, the quartz glass substrate becomes the substrate 30 before the liquid repellent portion 12 is formed.

In the present embodiment, the liquid chemical 17 having a component similar to the chemical 16 is used. As illustrated in FIG. 7A, the chemical 17 is stored in a liquid tank 50, and the substrate 30 is immersed in the liquid tank 50. Specifically, the substrate 30 is arranged in a direction in which the chemical 17 and the upper surface of the pedestal unit face each other. The front surface of the substrate 30 is then immersed in the chemical 17. The chemical 17 thereby attaches to the upper surface and the side surface of the pedestal unit and the outer peripheral region on the outer side of the pedestal unit. In other words, the liquid chemical 17 attaches to the front surface of the substrate 30.

As a result, the chemical 17 attached to the side surface of the pedestal unit and the outer peripheral region on the outer side of the pedestal unit becomes the liquid repellent portion 12, and the chemical 17 attached to the upper surface of the pedestal unit becomes the liquid repellent portion 32. Thereafter, as illustrated in FIG. 7B, the liquid repellent portion 12 is covered with the protective film 45. The RIE is then carried out from above the liquid repellent portion 32 to remove the liquid repellent portion 32 from the substrate 30. Thereafter, the protective film 45 is removed from the substrate 30. Thus, as illustrated in FIG. 7C, the substrate 30 becomes the template base material 11B. The liquid repellent portion 32 may be removed using a liquid (solvent) such as thinner, and the like in place of the RIE.

The protecting portion 31 may be provided at a position to form the liquid repellent portion 32. In this case, the upper surface of the pedestal unit does not make contact with the chemical 17, and thus the liquid repellent portion 32 is not formed on the upper surface of the pedestal unit. Therefore, the protecting portion 31 is removed instead of removing the liquid repellent portion 32. Furthermore, the protecting portion 31 may be a protective film such as a resin film, or a metal film or a semiconductor film. The liquid repellent portions 12, 32 may be formed by vapor deposition described in the first embodiment.

According to the fourth embodiment, the liquid repellent portion 32 is formed on the pedestal unit using the chemical 17, so that the liquid repellent portion 12 and the liquid repellent portion 32, which is a substitute of the protecting portion 31, can be simultaneously formed. The upper surface of the pedestal unit thus can be easily covered. Therefore, the template base material 11B can be easily produced.

Fifth Embodiment

A fifth embodiment will now be described using FIGS. 8 to 14. In the fifth embodiment, concave portions and convex portions are formed on the side surface of the seat unit. The liquid repellent property of the side surface of the seat unit with respect to the resist 25 thus becomes higher than the liquid repellent property of the front surface (for example, template pattern surface), the back surface, the side surface, or quartz of the template.

Figure 8:
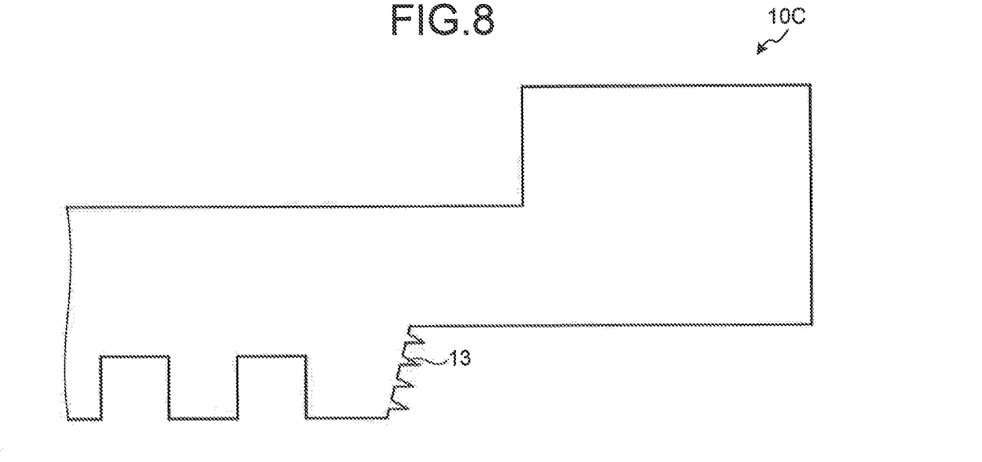
FIG. 8 is a view illustrating a configuration example of a template according to a fifth embodiment.

FIG. 8 is a view illustrating a configuration example of a template according to the fifth embodiment. In FIG. 8, the cross-sectional shape of one part of a template 10C is schematically illustrated. The template 10C is formed by scraping the template base material. The template 10C according to the fifth embodiment includes a pedestal unit at the central region on the front surface side.

The template 10C is formed with a liquid repellent portion 13 on the side surface of the seat unit. The liquid repellent portion 13 has a higher liquid repellent property with respect to the resist 25 than the front surface (for example, template pattern surface), the back surface, the side surface, or quartz of the template 10C. The liquid repellent portion 13 is formed to surround the side surface of the seat unit. The liquid repellent portion 13 has a higher contacting angle with respect to the resist 25 than a predetermined value (e.g., 60°). The liquid repellent portion 13 has a concave-convex structure, so that the liquid repellent property with respect to the resist 25 is enhanced by the lotus effect. The concave-convex structure may have a shape in which a concave portion and a convex portion are repeatedly lined at a predetermined period in a two-dimensional direction, or may have a shape in which such portions are unevenly lined.

In the present embodiment, a member having a high liquid repellent property is arranged on at least the side surface of the pedestal unit of the front surface side of the template 10C. According to such configuration, when the template 10C is pressed against the resist 25, the resist 25 can be prevented from leaking out to the outer side of the pedestal unit.

Figure 9:
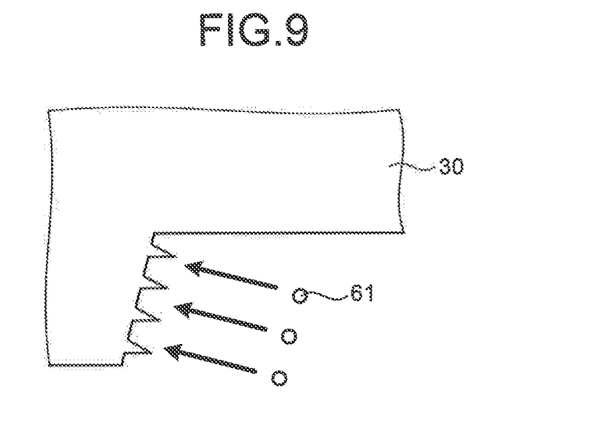
FIG. 9 is a view describing a first production process example of the template according to the fifth embodiment.

Next, a method for producing the template 10C will be described. FIG. 9 is a view describing a first production process example of the template according to the fifth embodiment. In the substrate 30, an area other than the side surface of the pedestal unit is covered in advance with a protective film 70 (not illustrated), and the like. When the side surface of the pedestal unit is subjected to wet etching in such a state, the concave-convex structure (liquid repellent portion 13) is formed on the side surface of the pedestal unit. HF (hydrofluoric acid), alkaline liquid 61, and the like are used, for example, for the wet etching herein. Thereafter, the protective film 70 is removed from the substrate 30, and the template pattern is formed on the pedestal unit, whereby the substrate 30 becomes the template 10C.

Figure 10A:
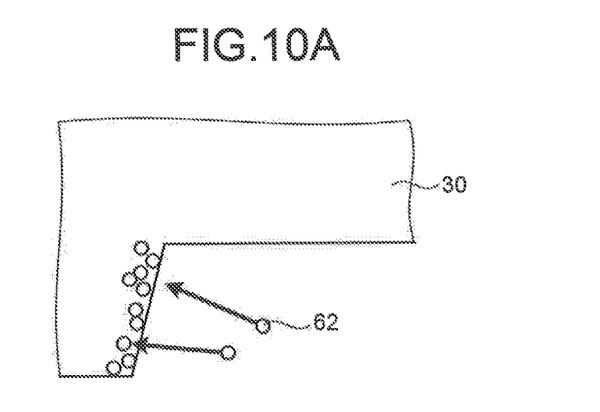
FIGS. 10A and 10B are views describing a second production process example of the template according to the fifth embodiment.
Figure 10B:
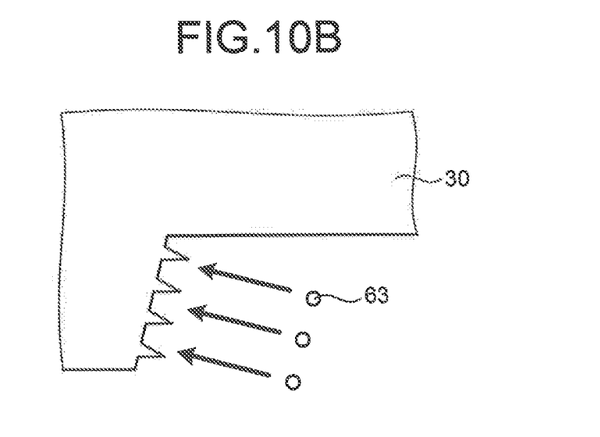

FIGS. 10A and 10B are views describing a second production process example of the template according to the fifth embodiment. In the substrate 30, an area other than the side surface of the pedestal unit is covered in advance with the protective film 70, and the like. An ion 62 such as Sb (antimony), and the like is ion implanted to the side surface of the pedestal unit in such a state. The substrate 30 thus becomes a state in which the Sb is injected to the side surface of the pedestal unit.

Thereafter, the side surface of the pedestal unit is subjected to the wet etching with respect to the substrate 30, so that the concave-convex structure (liquid repellent portion 13) is formed on the side surface of the pedestal unit. An alkaline liquid 63, and the like, for example, is used for the wet etching. The protective film 70 is then removed from the substrate 30 and the template pattern is formed on the pedestal unit, whereby the substrate 30 becomes the template 10C.

Figure 11:
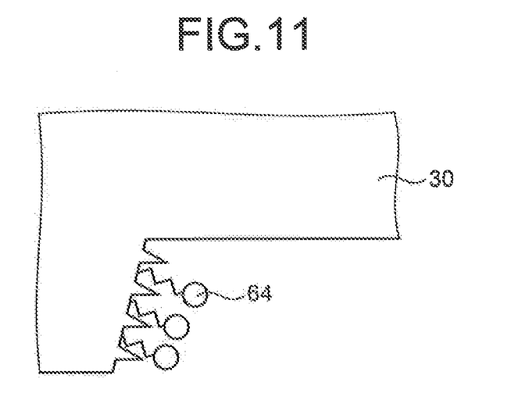
FIG. 11 is a view describing a third production process example of the template according to the fifth embodiment.

FIG. 11 is a view describing a third production process example of the template according to the fifth embodiment. In the substrate 30, an area other than the side surface of the pedestal unit is covered in advance with the protective film 70, and the like. A DSA (Directed Self-Assembly) material 64 is applied to the side surface of the pedestal unit in such a state. The DSA material 64 is, for example, a block copolymer containing material containing block copolymer (BCM) or a polymer mixed material containing a plurality of polymers.

When the substrate 30 applied with the DSA material 64 is subjected to annealing, the DSA material 64 self-organizes. A hydrophilic part and a lipophilic part contained in the DSA material 64 thereby gather together according to a predetermined rule. When the DSA material 64 is self-organized, the concave-convex structure (liquid repellent portion 13) forms on the side surface of the pedestal unit in the substrate 30. Thereafter, the protective film 70 is removed from the substrate 30, and the template pattern is formed on the pedestal unit, whereby the substrate 30 becomes the template 10C. The guide pattern may be formed on the side surface of the pedestal unit before the DSA material 64 is applied.

Figure 12:
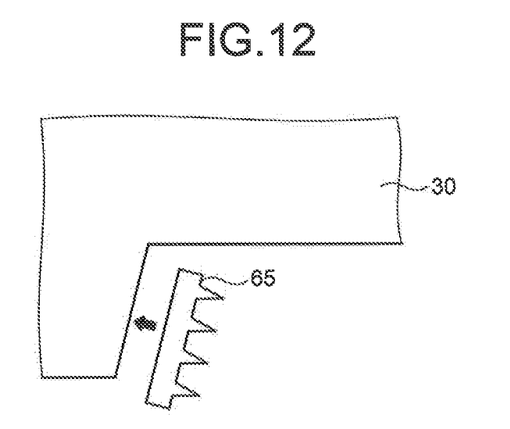
FIG. 12 is a view describing a fourth production process example of the template according to the fifth embodiment.

FIG. 12 is a view describing a fourth production process example of the template according to the fifth embodiment. When producing the template 10C, the DSA material 64 is applied to a predetermined sheet. The sheet applied with the DSA material 64 is subjected to annealing, and the DSA material 64 self-organizes. Thereafter, a sheet 65 (liquid repellent portion 13) in which the DSA material 64 is self-organized is attached to the side surface of the pedestal unit of the substrate 30. Subsequently, the protective film 70 is removed from the substrate 30 and the template pattern is formed on the pedestal unit, whereby the substrate 30 becomes the template 10C.

The template 10C may be such that either one of the hydrophilic part or the lipophilic part of after the DSA material 64 is self-organized is removed. The template 10C may be such that either one of the hydrophilic part or the lipophilic part is removed without self-organizing the DSA material 64. Furthermore, the template 10C may be such that the liquid repellent process is performed on the DSA material 64 after the DSA material 64 is self-organized.

Figure 13:
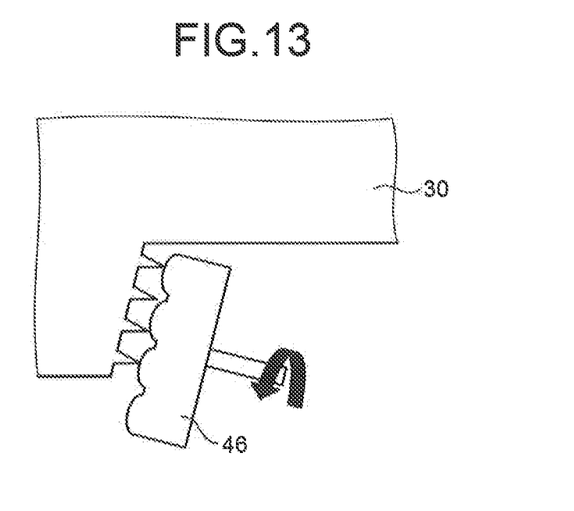
FIG. 13 is a view describing a fifth production process example of the template according to the fifth embodiment.

FIG. 13 is a view describing a fifth production process example of the template according to the fifth embodiment. The side surface of the pedestal unit is subjected to mechanical polishing by a working head 46 with respect to the substrate 30. The concave-convex structure (liquid repellent portion 13) forms on the side surface of the pedestal unit by the mechanical polishing. Thereafter, the protective film 70 is removed from the substrate 30, and the template pattern is formed on the pedestal unit, whereby the substrate 30 becomes the template 10C.

Figure 14:
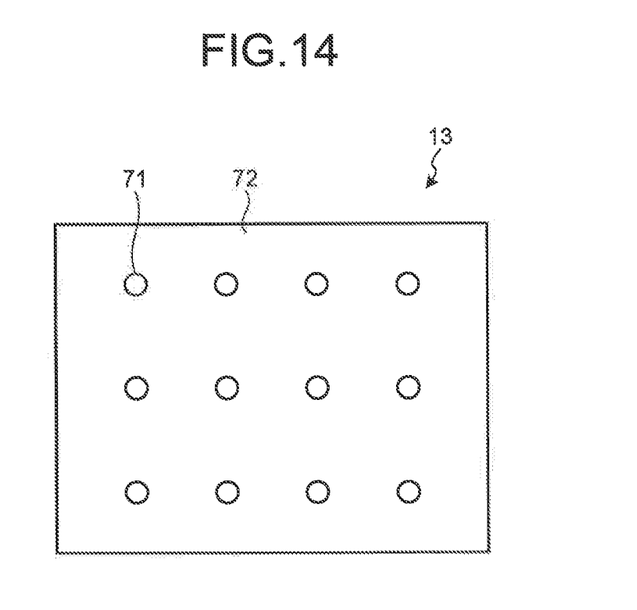
FIG. 14 is a view illustrating a configuration example of a liquid repellent portion according to the fifth embodiment.

FIG. 14 is a view illustrating a configuration example of the liquid repellent portion according to the fifth embodiment. In FIG. 14, the top view of the liquid repellent portion 13 is illustrated. The liquid repellent portion 13 has a shape, for example, in which a convex portion 71 and a concave portion 72 are repeatedly lined at a predetermined period in the two-dimensional direction. In the liquid repellent portion 13, for example, the area of the convex portion 71 is narrower than the area of the concave portion 72.

The liquid repellent portion 13 may be arranged with respect to the substrate 30 of after the template pattern is formed. In other words, the template pattern may be formed before the liquid repellent portion 13. In this case as well, the substrate 30 is formed with the liquid repellent portion 13 through a method similar to the template 10C.

According to the fifth embodiment, the template 10C can be easily formed since the liquid repellent portion 13 is formed using the wet etching, the ion implantation, and the like.

Sixth Embodiment

A sixth embodiment will now be described using FIG. 15. In the sixth embodiment, the liquid repellent portion is arranged on the template that does not include the pedestal unit.

Figure 15:
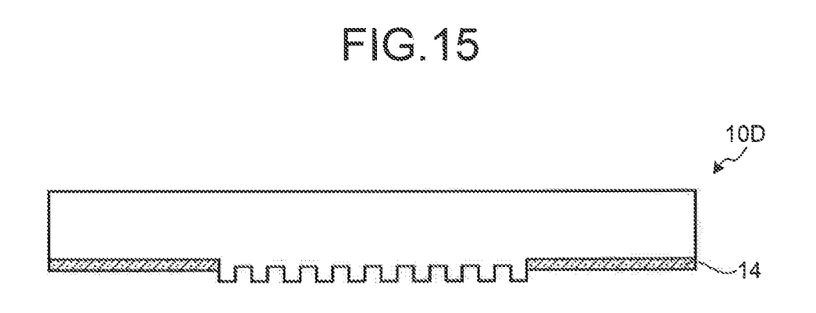
FIG. 15 is a view illustrating a configuration example of a template according to a sixth embodiment.

FIG. 15 is a view illustrating a configuration example of a template according to the sixth embodiment. A template 10D is formed by scraping the template base material. The template 10D according to the sixth embodiment does not include the seat unit. In the template 10D, the template pattern is formed in the central region on the front surface side. The template 10D is formed with a liquid repellent portion 14 in the outer peripheral region on the outer side of the pattern forming region where the template pattern is formed. The liquid repellent portion 14 has a higher liquid repellent property with respect to the resist 25 than the front surface (pattern forming region), the back surface, the side surface, or quartz of the template 10D.

When forming the template 10D, the outer peripheral region on the side of the front surface of the quartz glass substrate is scraped. The plate thickness of the outer peripheral region thus becomes thinner than the central region. Furthermore, the template pattern is formed in the central region on the side of the front surface of the quartz glass substrate. Moreover, the liquid repellent portion 14 is formed in the outer peripheral region on the side of the front surface of the quartz glass substrate. The liquid repellent portion 14 merely needs to be formed in the vicinity of the border of the central region and the outer peripheral region. The liquid repellent portion 14 is formed through the methods described in the first to fifth embodiments.

Either one of the formation of the template pattern and the formation of the liquid repellent portion 14 may be carried out first. Either one of the formation of the template pattern and the cutting of the outer peripheral region may be carried out first.

The templates 10A to 10D described in the first to sixth embodiments are used in the lithography step of when manufacturing a semiconductor device (semiconductor integrated circuit). The lithography is carried out for every layer of the wafer process, for example. Specifically, one of the templates 10A to 10D is produced in advance. The imprint process is carried out with one of the templates 10A to 10D on the wafer applied with the resist 25. In the imprint process, for example, the resist 25 is patterned through a step and repeat method (repetition of impressing and separation with respect to resist 25). Thereafter, the lower layer side of the resist pattern is etched. The actual pattern corresponding to the template pattern is thereby formed on the wafer. When manufacturing the semiconductor device, the production process of the templates 10A to 10D, the imprint process, the etching process, and the like are carried out for every layer.

According to the sixth embodiment, the run-out of the resist 25 when the template 10D is impressed on the resist 25 can be suppressed, similar to the first embodiment. As a result, the desired resist pattern can be formed and the breakage of the template 10D can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template forming method comprising:
    forming a pedestal region to which a template pattern is to be formed on a first surface of a substrate; and
    forming a liquid repellent portion, the liquid repellent portion being formed on a side surface of the pedestal region, the liquid repellent portion having a concave-convex surface,
    wherein the side surface is a side wall of the pedestal region.

2. The template forming method according to claim 1, wherein the liquid repellent portion has a higher contacting angle with respect to a resist to which the template pattern is to be transferred than a portion without the liquid repellent portion.

3. The template forming method according to claim 1, wherein
    the liquid repellent portion is formed on a region on an outer side of the pedestal region.

4. The template forming method according to claim 1, wherein a height of a convex portion of the liquid repellent portion is lower than a height of the template pattern.

5. The template forming method according to claim 1, wherein
    a first protecting portion is arranged on the first surface,
    the liquid repellent portion is formed in a region other than the first protecting portion on the side of the first surface, and
    the first protecting portion is removed.

6. The template forming method according to claim 1, wherein the concave-convex surface of the liquid repellent portion is formed by wet-etching using hydrofluoric acid and alkaline liquid.

7. The template forming method according to claim 5, wherein the liquid repellent portion is formed by immersion in a chemical.

8. The template forming method according to claim 5, wherein the concave-convex surface of the liquid repellent portion is formed by covering a region other than the side surface of the pedestal region with a protective film, applying self-assembly material to the side surface of the pedestal region exposed from the protective film, and annealing the self-assembly material.

9. The template forming method according to claim 5, wherein the first protecting portion is a film containing silane.

10. The template forming method according to claim 5, wherein the first protecting portion and the liquid repellent portion are simultaneously formed by vapor depositing a first chemical or immersing in a second chemical.

11. The template forming method according to claim 5, wherein the first protecting portion is formed by forming a metal film or a semiconductor film on the first surface.

12. The template forming method according to claim 5, wherein the first protecting portion is a shielding member proximately arranged with respect to the first surface.

13. The template forming method according to claim 1, wherein a convex portion of the liquid repellent portion is formed from a same member as an end portion of the substrate.

14. The template forming method according to claim 1, wherein an upper surface area of a convex portion of the liquid repellent portion is smaller than a bottom surface area of a concave portion of the liquid repellent portion.

15. The template forming method according to claim 13, wherein the liquid repellent portion repels a resist by lotus effect.

16. The template forming method according to claim 1, wherein the liquid repellent portion is formed by attaching a fluorinated solvent.

17. The template forming method according to claim 1, wherein the liquid repellent portion is formed by etching using a hydrofluoric acid and an alkaline liquid.

18. The template forming method according to claim 1, wherein the liquid repellent portion is formed by an ion implantation of antimony and etching using an alkaline liquid.

19. The template forming method according to claim 6, wherein the concave-convex surface of the liquid repellent portion is formed by implanting ion into the substrate before the wet-etching.

20. The template forming method according to claim 1, wherein the concave-convex surface of the liquid repellent portion is formed by mechanical polishing.

21. The template forming method according to claim 1, wherein a convex portion of the liquid repellent portion consists of a single material.

22. The template forming method according to claim 1, wherein an area of a convex portion of the liquid repellent portion becomes smaller as a distance from the substrate increases.

23. The template forming method according to claim 1, wherein a space between convex portions of the liquid repellent portion is smaller than pattern dimensions of the template pattern.

24. A pattern forming method comprising:
    providing a resist on a processing film;
    pressing a first surface of a template against the resist, the template having a pedestal region, the pedestal region including a template pattern on the first surface of the template, the pedestal region having a concave-convex surface on a side surface, wherein the side surface is a side wall of the pedestal region;
    filling the template pattern with the resist;
    irradiating the template with a UV light and curing the resist;
    separating the template from the resist; and
    etching the processing film by using a resist pattern as a mask.

25. A method of manufacturing a semiconductor device comprising:
    forming a processing film on a semiconductor substrate;
    providing a resist on the processing film;
    pressing a first surface of a template against the resist, the template having a pedestal region, the pedestal region including a template pattern on the first surface of the template, the pedestal region having a concave-convex surface on a side surface, wherein the side surface is a side wall of the pedestal region;
filling the template pattern with the resist;
irradiating the template with a UV light and curing the resist;
separating the template from the resist; and
etching the processing film by using a resist pattern as a mask.

* * * * *